(12) United States Patent
Hattori

(10) Patent No.: US 11,221,945 B2
(45) Date of Patent: Jan. 11, 2022

(54) SEMICONDUCTOR MEMORY DEVICE

(71) Applicant: Winbond Electronics Corp., Taichung (TW)

(72) Inventor: Norio Hattori, Kanagawa (JP)

(73) Assignee: Winbond Electronics Corp., Taichung (TW)

(*) Notice: Subject to any disclaimer, the term of this patent is extended or adjusted under 35 U.S.C. 154(b) by 243 days.

(21) Appl. No.: 16/742,872

(22) Filed: Jan. 14, 2020

(65) Prior Publication Data
US 2020/0310960 A1     Oct. 1, 2020

(30) Foreign Application Priority Data
Mar. 27, 2019   (JP) ............................. JP2019-060533

(51) Int. Cl.
*G06F 12/00*     (2006.01)
*G06F 12/02*     (2006.01)
*G11C 16/16*     (2006.01)

(52) U.S. Cl.
CPC .......... *G06F 12/0246* (2013.01); *G11C 16/16* (2013.01); *G06F 2212/7201* (2013.01); *G06F 2212/7211* (2013.01)

(58) Field of Classification Search
CPC ......... G06F 12/0246; G06F 2212/7201; G06F 2212/7211; G06F 2212/1016; G06F 2212/1036; G06F 2212/7205; G06F 2212/7207; G06F 2212/7208; G06F 12/10; G11C 16/16; G11C 2029/4402; G11C 16/0483; G11C 16/08; G11C 16/20; G11C 16/3404; G11C 29/54; G11C 16/10; G11C 16/3418

USPC ......................................................... 711/154
See application file for complete search history.

(56) References Cited

U.S. PATENT DOCUMENTS

| | | | |
|---|---|---|---|
| 9,431,116 B2 | 8/2016 | Sun et al. | |
| 2004/0145952 A1* | 7/2004 | Chen | G11C 16/3459 365/185.33 |
| 2006/0282644 A1* | 12/2006 | Wong | G06F 12/0246 711/206 |

FOREIGN PATENT DOCUMENTS

| CN | 106297881 | 1/2017 |
|---|---|---|
| JP | 2009175877 | 8/2009 |
| TW | I537964 | 6/2016 |

* cited by examiner

*Primary Examiner* — Mardochee Chery
(74) *Attorney, Agent, or Firm* — JCIPRNET

(57) ABSTRACT

A semiconductor memory device capable of smoothing the number of cycles of programming/erasing between blocks is provided. The semiconductor memory device includes: a memory cell array; an address translation table defining a relationship between logical address information and physical address information; an invalid block table managing the physical address information for identifying to-be-erased blocks of the blocks; a free block table managing the physical address information used for identifying erased usable blocks; an erasing element for erasing the blocks; a controller. When an erasing command and first logical address information are received from environment, the controller erases the block of the physical address information selected from the invalid block table, and rewrites the address translation table in a manner that the physical address information selected from the free block table corresponds to the first logical address information received from the external environment.

10 Claims, 9 Drawing Sheets

FIG. 5(A) Translation table

FIG. 5(B) LUT

| PBA# | PPA# | Normal | Spare LBA | State |
|---|---|---|---|---|
| 00h | 00h | LUP0 | FFh | S |
|  | 01h | LUP1 | FFh | S |
|  | 02h | Erase | E | E |
|  | 03h | Erase | E | E |
| 01h | 00h | Erase | 00h | V |
|  | 01h | Erase | E | E |
|  | 02h | Erase | E | E |
|  | 03h | Erase | E | I |
| 02h | 00h | Erase | E | BB |
|  | 01h | Erase | E | E |
|  | 02h | Erase | E | E |
|  | 03h | Erase | E | E |
| 03h | 00h | UD03 | 01h | V |
|  | 01h | UD06 | E | E |
|  | 02h | UD07 | E | E |
|  | 03h | Erase | E | I |
| 07h | 00h | UD16 | 01h | V |
|  | 01h | Erase | E | E |
|  | 02h | Erase | E | E |
|  | 03h | Erase | E | E |
| 08h | 00h | Erase | E | E |
|  | 01h | Erase | E | E |
|  | 02h | Erase | E | E |
|  | 03h | Erase | E | E |
| 09h | 00h | Erase | E | E |
|  | 01h | Erase | E | E |
|  | 02h | Erase | E | E |
|  | 03h | Erase | E | E |

FIG. 6

FIG. 11(A)  Translation table

FIG. 11(B)  LUT

| PBA# | PPA# | Normal | Spare | |
|---|---|---|---|---|
| | | | LBA | State |
| 00h | 00h | LUP0 | FFh | S |
| | 01h | LUP1 | FFh | S |
| | 02h | Erase | E | E |
| | 03h | Erase | E | E |
| 01h | 00h | Erase | E | E |
| | 01h | Erase | E | E |
| | 02h | Erase | E | E |
| | 03h | Erase | E | E |
| 02h | 00h | Erase | E | BB |
| | 01h | Erase | E | E |
| | 02h | Erase | E | E |
| | 03h | Erase | E | E |
| 03h | 00h | UD03 | 01h | V |
| | 01h | UD06 | E | E |
| | 02h | UD07 | E | E |
| | 03h | Erase | E | I |
| ... | ... | ... | ... | ... |
| 07h | 00h | UD16 | 01h | V |
| | 01h | Erase | E | E |
| | 02h | Erase | E | E |
| | 03h | Erase | E | I |
| 08h | 00h | Erase | 01h | V |
| | 01h | Erase | E | E |
| | 02h | Erase | E | E |
| | 03h | Erase | E | E |
| 09h | 00h | Erase | E | E |
| | 01h | Erase | E | E |
| | 02h | Erase | E | E |
| | 03h | Erase | E | E |

FIG. 12

| Entry# | PBA# |
|---|---|
| 0 | 09h |
| 1 | 01h |

FBT

FIG. 13(A)

| Entry# | PBA# |
|---|---|
| 0 | 03h |
| 1 | 07h |

IBT

FIG. 13(B)

| PBA# | State |
|---|---|
| 00h | S |
| 01h | E |
| 02h | BB |
| 03h | I |
| 04h | V |
| 05h | V |
| 06h | V |
| 07h | I |
| 08h | V |
| 09h | E |

SBT

FIG. 13(C)

SEMICONDUCTOR MEMORY DEVICE

CROSS-REFERENCE TO RELATED APPLICATION

This application claims the priority benefit of Japan patent application serial no. 2019-060533, filed on Mar. 27, 2019. The entirety of the above-mentioned patent application is hereby incorporated by reference herein and made a part of this specification.

BACKGROUND

Technical Field

The disclosure relates to a semiconductor memory device, and particularly relates to a wear leveling technique for smoothing the number of cycles of programming/erasing between blocks of an NAND flash memory.

Description of Related Art

Generally, an NAND flash memory is constituted by a memory chip and a memory controller configured to control the memory chip in a package. The memory controller is in charge of a fixed load, such as error correction or bad block management of the memory chip, which may reduce a computation load of a host side.

For example, a flash memory system in Japan Patent Laid-Open Application No. 2009-175877 includes a flash memory 10 and a host device 40 as shown in FIG. 1, where the flash memory 10 includes a memory controller 20 and a memory chip 30. The memory controller 20 includes a host interface 22 for transferring data to/receiving data from the host device 40, a memory interface 24 for transferring data to/receiving data from the memory chip 30, a microprocessor unit (MPU) that controls data transfer or operations of the memory chip, a read-only memory (ROM) for storing programs or data, a random access memory (RAM) for storing programs or data, etc. The memory chip 30 is, for example, a chip of a NAND flash memory.

In the NAND flash memory, reading and programming operations are performed in unit of pages, and an erasing operation is performed in unit of blocks. When the host device instructs the operations, it outputs a logical address for reading, programming, and erasing to the memory controller. The memory controller translates the received logical address into a physical address with reference to a translation table maintained in a SRAM, and performs the programming operation toward a memory cell array. When power is turned on, the translation table is loaded to the SRAM from a prepared area in the memory cell array.

Moreover, in the flash memory, when the number of cycles of programming/erasing increases, deterioration of durability and data retention ability becomes significant. The reason of such deterioration may result from the increase in the number of cycles of programming/erasing, whereby electrons are trapped by a gate oxide film, or the gate oxide film itself is deteriorated due to tunneling of the electrons. When the number of cycles of programming/erasing toward a specific block increases, an unusable block is eventually generated, and utilization efficiency of the memory cell array decreases. Therefore, it is desired that the number of cycles of programming/erasing between the blocks of the memory cell array is as uniform as possible.

Further, in the flash memory, information indicating a state of the current block and the translation table of the logical addresses/the physical addresses are maintained in the SRAM, and in order to deal with a sudden power failure, the backup information is saved in an area determined by the memory cell array, such as a spare area. Then, when the power is turned on again, the translation table is rebuilt in the SRAM based on the information read from the spare area. However, the programming operation toward the spare area leads to an increase in the number of cycles of programming, and a normal area on the same page may be disturbed due to application of a programming voltage. The disturbance is referred to as Program Gate Disturb (PGD). In the worst case, the increase in the number of cycles of programming and the PGD may cause deterioration of data in the normal area.

SUMMARY

The disclosure is directed to a semiconductor memory device capable of smoothing the number of cycles of programming/erasing between blocks, and capable of suppressing the number of cycles of programming and effectively employing a spare area.

The disclosure provides a semiconductor memory device including: a memory cell array including a plurality of blocks; a first holding element, holding translation information used for translating logical address information into physical address information; a second holding element, holding physical address information for identifying to-be-erased blocks of the blocks; a third holding element, holding the physical address information for identifying erased usable blocks selected based on the number of cycles of programming/erasing; an erasing element, erasing the blocks of the memory cell array; and a control element, wherein when an erasing command and first logical address information are received from external, the control element translates the first logical address information into first physical address information based on the translation information, and when second physical address information held by the second holding element is inconsistent with the first physical address information, the control element controls the erasing element to erase a block corresponding to the second physical address information, and the control element updates the translation information of the first holding element in a manner that the third physical address information held by the third holding element corresponds to the first logical address information.

In an embodiment, the control element adds the first physical address information to the second holding element, and deletes the third physical address information from the third holding element. In an embodiment, the semiconductor memory device further includes a programming element, and the programming element is configured to program data on a selected page of the memory cell array, and the control element controls the programming element to program the first logical address information and a state indicating that the block is in use in a spare area of a selected page of the block corresponding to the third physical address information. In an embodiment, the control element controls the programming element to program a state indicating that the block has become a to-be-erased block in a spare area of a selected page of a block corresponding to the first physical address information. In an embodiment, information associated with a state of a block is programmed in an area determined by the memory cell array, and the control element generates information held by the first holding element, the second holding element, the third holding element based on the information associated with the state.

In an embodiment, when the control element is powered on, the control element reads out information associated with the state from the memory cell array. In an embodiment, the semiconductor memory device further includes a fourth holding element, and the fourth holding element holds information associated with a state of each of the blocks when performing an erasing operation, the control element programs the information associated with the state held by the fourth holding element in a corresponding spare area of the memory cell array when performing a programming operation. In an embodiment, the fourth holding element holds the information associated with the state in a non-volatile memory.

According to the disclosure, the number of cycles of programming/erasing between the blocks of the memory cell array is smoothed to improve the utilization efficiency of the memory unit cell. Therefore, according to the disclosure, the number of cycles of programming may be reduced in case that it is able to program the information associated with the state in the spare area.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 5(A) is a schematic diagram of and address translation table held in SRAM, and FIG. 5(B) is a schematic diagram of current reference table held in SRAM.

FIG. 6 is a schematic diagram of states of the blocks of a memory cell array.

FIG. 11(A) and FIG. 11(B) are schematic diagrams of a rewritten address translation table and current reference table during an erasing operation.

FIG. 12 is a schematic diagram of states of various blocks of a memory cell array during the erasing operation.

FIG. 13(A), FIG. 13(B), and FIG. 13(C) are schematic diagrams of a rewritten free block table, an invalid block table, and a state block table during the erasing operation.

DESCRIPTION OF THE EMBODIMENTS

The embodiments of the disclosure are described in detail with reference of figures. The flash memory of the disclosure is composed of a memory device having NAND memory cells and a controller that controls the memory device. The controller may be formed on a same chip as the chip forming the memory device, or may be formed on a different chip. Moreover, when the flash memory includes a plurality of chips, the flash memory may also be formed by stacking the plurality of chips.

Embodiments

Figure 1:
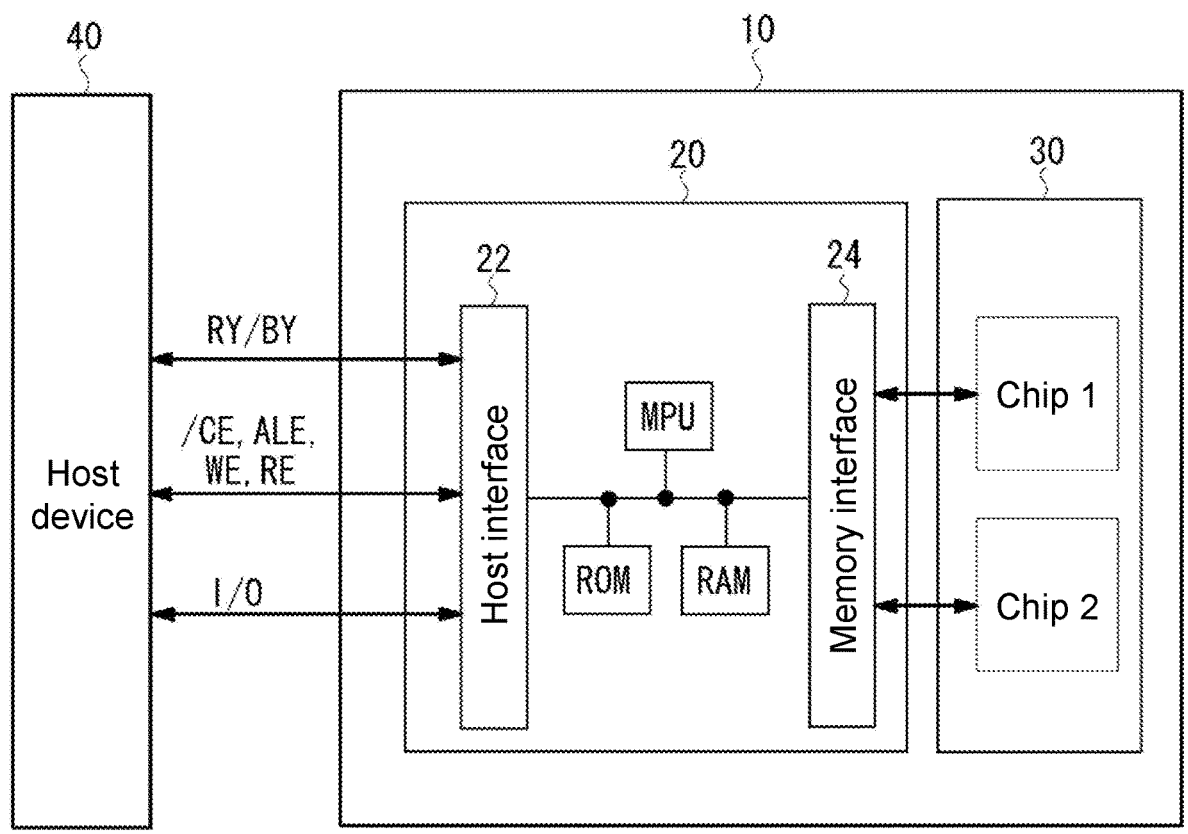
FIG. 1 is an example of an existing semiconductor memory.
Figure 2:
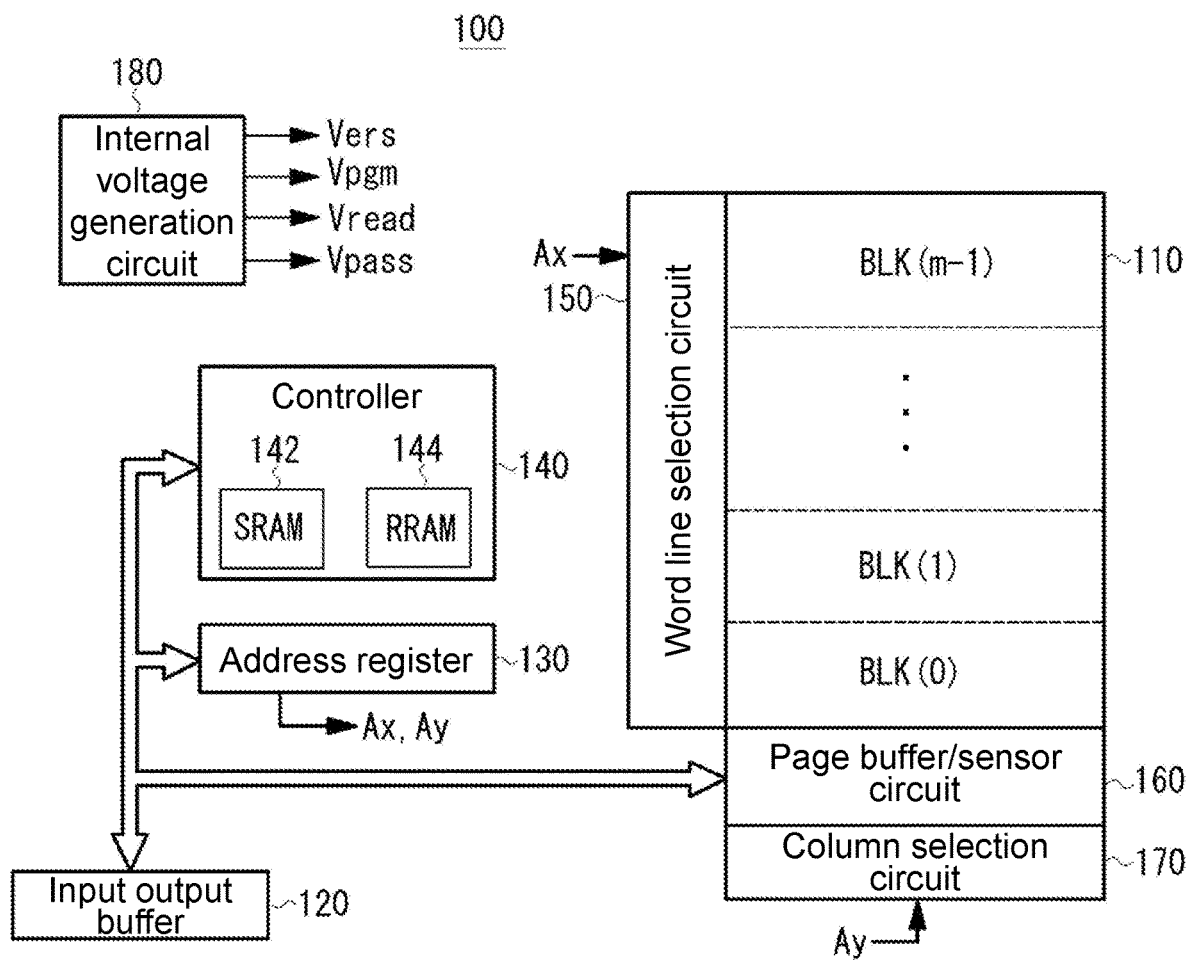
FIG. 2 is a diagram illustrating an overall configuration of a flash memory according to an embodiment of the disclosure.

FIG. 2 is a diagram illustrating an internal configuration of a flash memory 100 according to an embodiment of the disclosure. The flash memory 100 of the embodiment receives various control signals (a Command Latch Enable (CLE) signal, an Address Latch Enable (ALE) signal, etc.), data, commands, etc., from a host device, and performs reading, programming (writing), erasing operations according to these signals. Moreover, the flash memory 100 outputs a read signal or a busy signal representing an operation state of the memory to the host device.

The flash memory 100 includes following components: a memory cell array 110, which has a plurality of memory cells arranged in an array; an input output buffer 120, which is connected to an external input output terminal I/O; an address register 130, which receives address data from the input output buffer 120; a controller 140, which receives command data, etc., from the input output buffer 120 to control the various components; a word line selection circuit 150, which receives row address information Ax from the address register 130, decodes the row address information Ax, and selects a block and a word line based on a decoding result; a page buffer/sensor circuit 160, which holds data read from a page selected by the word line selection circuit 150, or holds input data that should be programmed on the selected page; a column selection circuit 170, which receives column address information Ay from the address register 130, decodes the column address information Ay, and selects data of a column address in the page buffer/sensor circuit 160 based on the decoded result; and an internal voltage generating circuit 180, which generates various voltages (a programming voltage Vpgm, a passing voltage Vpass, a read passing voltage Vread, an erasing voltage Vers, etc.) required for the reading, programming and erasing operations of data.

Figure 3:
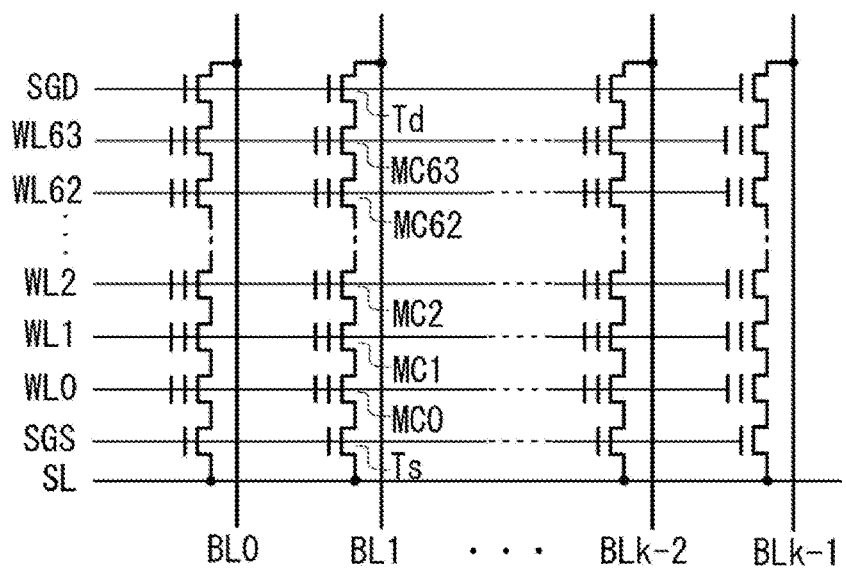
FIG. 3 is a diagram illustrating an internal configuration of blocks of a memory cell array according to an embodiment of the disclosure.

The memory cell array 110 has m blocks BLK(0), BLK(1), ..., BLK(m−1) in a column direction. As shown in FIG. 3, in one block, there are n NAND strings connecting a plurality of memory cells in series in the row direction. The memory cells in one row direction construct one page (for example, 2 KB). One NAND NU includes a plurality of memory cells MCi (i=0, 1, 2, 3, ..., 63) connected in series, and a bit line side selection transistor Td connected to a drain side of the memory cell MC63 serving as an end portion at one side, and a source line side selection transistor Ts connected to a source side of the memory cell MC0. A drain of the bit line side selection transistor Td is connected to a corresponding bit line BL in bit lines BL0-BLK−1, and a source of the source line side selection transistor Ts is connected to a common source line SL. The memory cell may be either a memory cell storing one-bit data or a memory cell storing multiple-bit data. Furthermore, the memory cell array may be either a memory cell array that is two-dimensionally formed on a substrate or a memory cell array that is three-dimensionally formed on the substrate.

Figure 4:
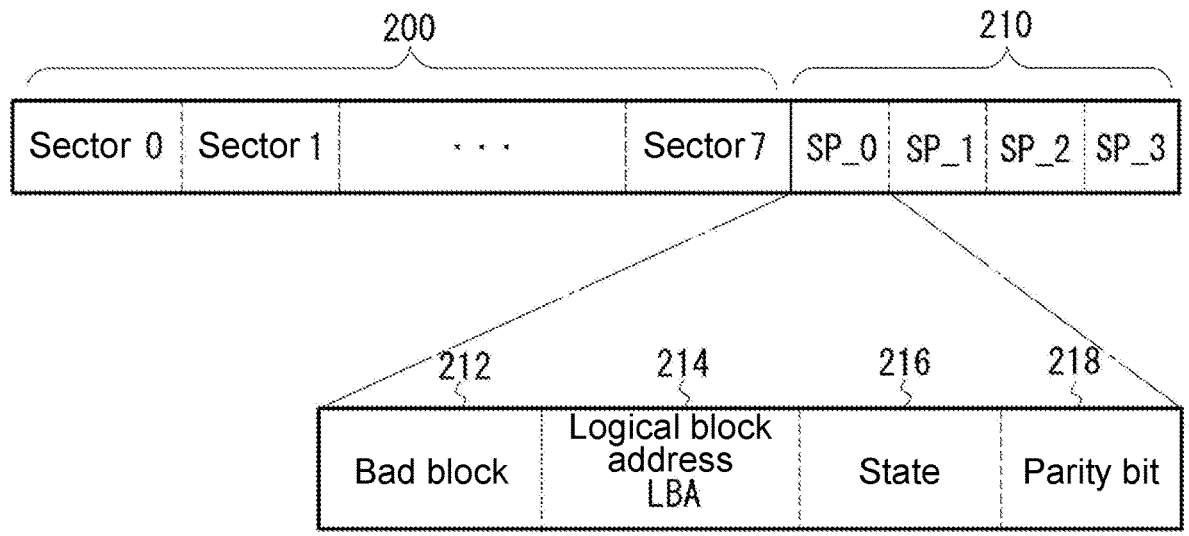
FIG. 4 is a diagram of configuration within a block of a flash memory according to the embodiment of the disclosure.

In each block of the memory cell array 110, i.e. each page that forms the block is divided into a normal area used by the user and a spare area used to store various management information, etc. For example, one page of the memory cell array 110 is as that shown in FIG. 4, and includes a normal area 200 containing 8 sectors (sector 0-sector 7), and a spare area 210 containing 4 sectors of a spare SP_0, a spare SP_1, a spare SP_2 and a spare SP_3. For example, one sector of the normal area 200 is 256 bytes (2K bytes in overall), and one sector of the spare area 210 is 16 bytes (64 bytes in overall).

The spare area stores information 212 for identifying bad blocks containing bad memory elements, information 214 for identifying a logical block address LBA corresponding to a physical block address PBA of the block, information 216 associated with a state of the block and a parity bit 218. The information associated with the state is described later, which, for example, includes an erased block (E), a valid block in use (V), a to-be-erased invalid block (I), the number of cycles of programming/erasing EW, etc.

The controller 140, for example, includes a microprocessor (MPU), a Read-Only Memory (ROM), etc., and by executing a software program saved in the ROM, the controller 140 controls the reading, programming and erasing operations of the flash memory 100. Therefore, the controller 140 of the embodiment includes SRAM 142 and a resistance variable memory (Resistance Random Access Memory (RRAM)) 144, and performs read and write control of the SRAM 144 and the RRAM 144.

The SRAM 142 is a general term for a volatile memory that may be read and written at high speed, which includes a plurality of registers. When the SRAM 142 is powered on, and the controller 140 executes a power-on sequence, the SRAM 142 holds data loaded from a specific page or a predetermined spare area of a specific block of the memory cell array 110. The controller 140 may produce various tables according to the data loaded to the SRAM 142, and save the produced tables in the SRAM 142, or rewrite the tables as needed. The table are, for example, a translation table defining a relationship between the logical block address LBA and the physical block address PBA, a table showing information associated with the state of each block of the memory cell array 110, etc.

The SRAM 12 is a volatile memory, so that in case of power off, data such as a table held in the SRAM 142 will be lost. Therefore, when the data held in the SRAM 142 is rewritten, the backup data is programmed to a spare area of the memory cell array. Moreover, when the power is turned on again, the table, etc., of the SRAM 142 is reconstructed by using the data read from the spare area.

The RRAM 144 is a variable resistance RAM that may store data in a reversible and non-volatile variable resistance element. The RRAM 144 is a non-volatile memory that may read and write data as fast as SRAM 142, and may retain data even if power is off.

The RRAM 144 may function as a backup in the SRAM 142. The RRAM 144 stores a part of the data held in the SRAM 142, and when there is a change in the table, etc., of the SRAM 142, the content of the change may be stored, and the programming towards the spare area of the memory cell array may be postponed. The controller 140 may program the data stored in the RRAM 144 to a spare area of the memory cell array at an appropriate timing. In one embodiment, when the data is programmed in the normal area, the data in the RRAM 144 is simultaneously programmed in the spare area. As a result, the number of cycles of programming may be reduced, and the Programming Gate Disturb (PGD) to the normal area that that is only generated when programming in the spare area may be suppressed.

In a reading operation of the flash memory, a certain positive voltage is applied to the bit line, a certain voltage (for example, 0V) is applied to a selected word line, and a passing voltage (for example, 4.5V) is applied to a non-selected word line, a positive voltage (for example, 4.5V) is applied to a selected gate line SGD and a selected gate line SGS, the bit line side selection transistor Td and the source line side selection transistor Ts are turned on, and the common source line SL is set to 0V. In a programming operation, a high-voltage programming voltage (for example, 15V to 20V) is applied to the selected word line, an intermediate potential (for example, 10V) is applied to the non-selected word line, the bit line side selection transistor Td is turned on, and the source line side selection transistor Ts is turned off, and a potential corresponding to data "0" or data "1" is supplied to the bit line BL. In an erasing operation, 0V is applied to the selected word line in the block, a high voltage (such as 20V) is applied to a P-well, and electrons of a floating gate are extracted to the substrate, thereby erasing data in terms of the block.

Then, the operations of the flash memory 100 of the embodiment are described below. When the flash memory 100 is powered on, the controller 140 executes power-on sequence, and the data stored in the specific page of a start block of the memory cell array 110, the logical block address LBA stored in the spare area of each block, and the state-related data shown in FIG. 6 are loaded into the SRAM 142. The controller 140 produces an address translation table as shown in FIG. 5(A) and a current reference table LUT as shown in FIG. 5(B) based on the loaded information, and holds the tables in the SRAM 142.

The symbol "S" used in a state column of FIG. 5(B) and FIG. 6 represents a block used by the system, "E" represents an erased usable block, "V" represents a valid block that is in use, "I" represents a to-be-erased invalid block, and "BB" represents a bad block that cannot be used.

When one block includes two states of (V) and (I), the state (I) has priority, and when one block includes two states of (V) and (E), the state (V) has the priority. When one block includes two states of (BB) and (E), the state (BB) has the priority. For example, in a physical block address PBA (03h) of the memory unit array shown in FIG. 6, "V" is programmed on a page PPA (00h) and "I" is programmed on a page PPA (03h), and since "I" has the priority, the block is identified as a to-be-erased invalid block. Therefore, a logical block address LBA (01h) of the spare area cannot be used as a valid address, i.e., it cannot be reflected in the translation table of FIG. 5(A), and is reflected as "I" in the current reference table LUT of FIG. 5(B). Moreover, in the physical block address PBA (02h) of FIG. 6, the state is programmed as "BB", so it is reflected as "BB" in the current reference table LUT.

Figures 7, 8A, 8B, 8C:
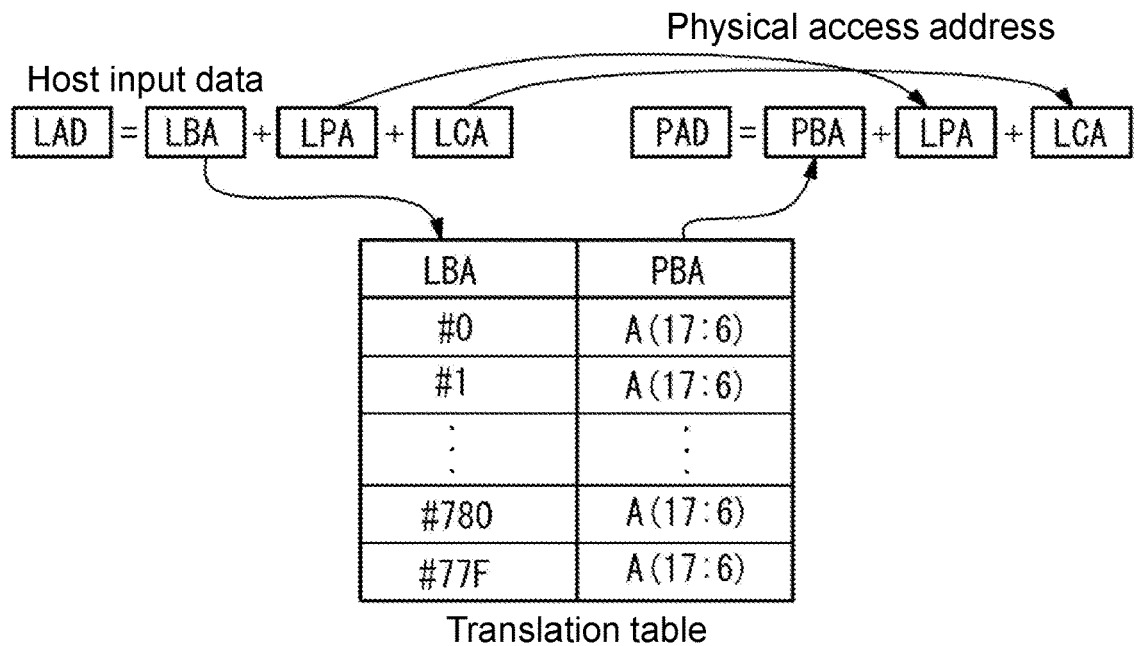
FIG. 7 is a diagram illustrating an operation of translating a logical address input from a host device into a physical address.
FIG. 8(A), FIG. 8(B), and FIG. 8(C) are schematic diagrams of a free block table, an invalid block table and a state block table of the embodiment of the disclosure.

The controller 140 translates a logical address LAD input from the host device into a physical address PAD with reference of the address translation table shown in FIG. 5(a). The logical address LAD is composed of a logical block address LBA, a logical page address LPA, and a logical column address LCA as shown in FIG. 7. For example, a row address for accessing the flash memory 100 is 18 bits, and a column address is 12 bits. The upper 12 bits of the row address are the address of the specified block, and the lower 6 bits are the address of the specified page. The logical page address LPA and the logical column address LCA are not translated and directly constitute a physical address. Therefore, the logical address LAD is translated into a physical address PAD (=PBA+LPA+LCA) for accessing the flash memory.

The controller 140 may use the current reference table LUT shown in the FIG. 5(B) to manage smoothing of the number cycles of programming/erasing of each block, but in the embodiment, in order to shorten a block searching time to improve its processing speed, three tables shown in FIG. 8(A)-FIG. 8(C) are generated.

A Free Block Table (FBT) shown in FIG. 8(A) is a table for managing erased blocks and blocks that may be used next. The FBT is generated based on the blocks with the state "E" and the number of cycles of programming/erasing EW in the current reference table LUT of FIG. 5(B). The FBT is, for example, stored in a first-in-first-out (FIFO) register that is read out in the order of the physical block address PBA that is written first, and in this case, writing is first performed from a block with the small number of cycles of programming/erasing EW. The number of cycles of programming/erasing EW need not be the same in each page within a block. Erasing is performed in terms of block, so that it is reflected evenly in each page; and programming is performed in terms of page, so that the number of cycles of programming is different between pages. The number of cycles of programming/erasing EW is counted in terms of block, i.e. even if a page in the block is performed, the number of cycles of programming/erasing EW is increased by one.

An Invalid Block Table (IBT) shown in FIG. 8(B) is a table for managing to-be-erased blocks. The IBT is generated based on the blocks with the state "I" and the number of cycles of programming/erasing EW thereof in the current reference table LUT of FIG. 5(B). The IBT is also stored in a FIFO-type register, and is written from a page with the small number of cycles of programming/erasing EW.

A State Block Table (SBT) shown in FIG. 8(C) stores the states of the current reference table LUT shown in FIG. 5(B). The SBT is generated by using the states of all blocks in the current reference table LUT of FIG. 5(B). The SBT is saved to the RRAM 144, and if the state of the block is changed during operation, the change is saved.

Figure 9:
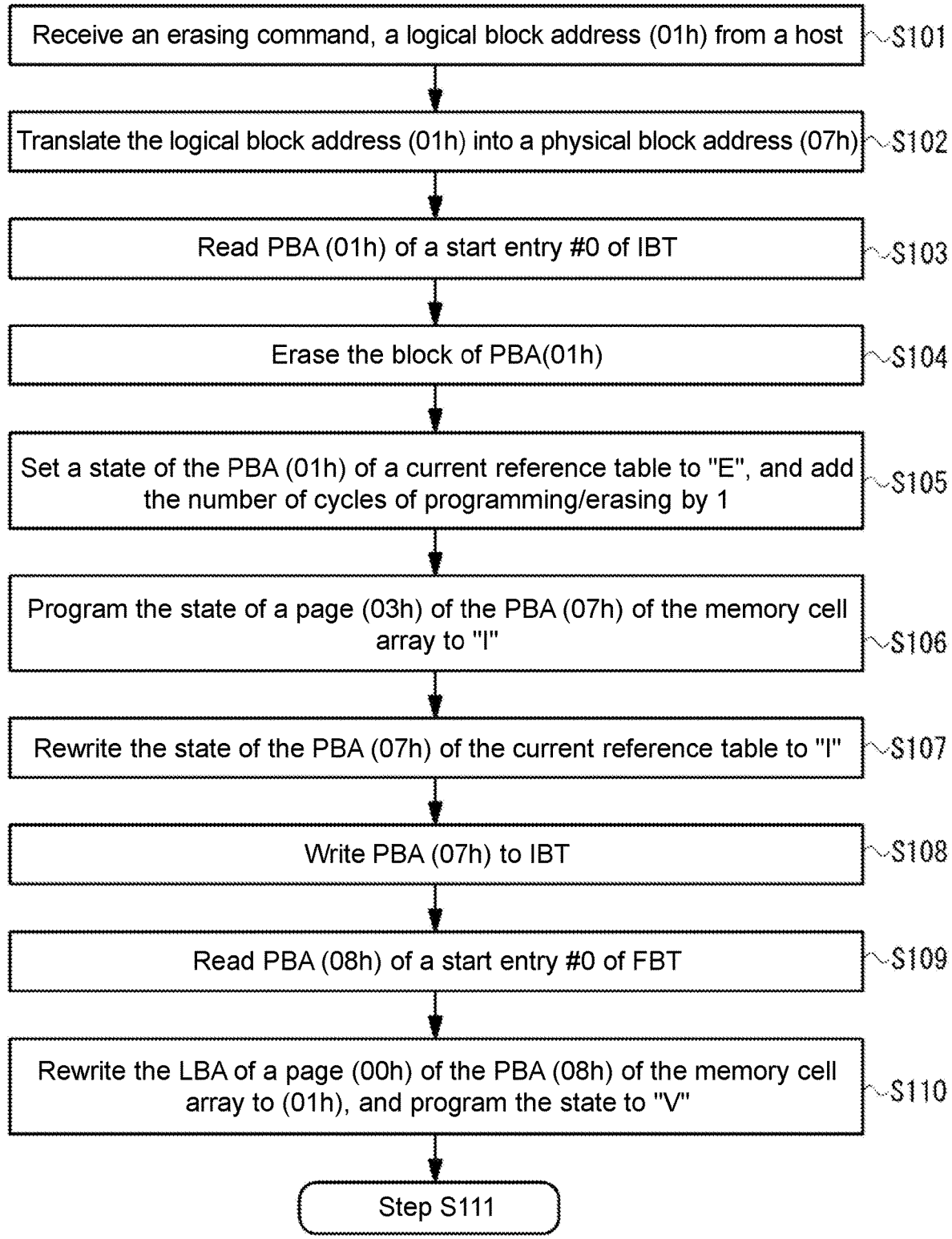
FIG. 9 is a flowchart illustrating an erasing operation according to an embodiment of the disclosure.
Figure 10:
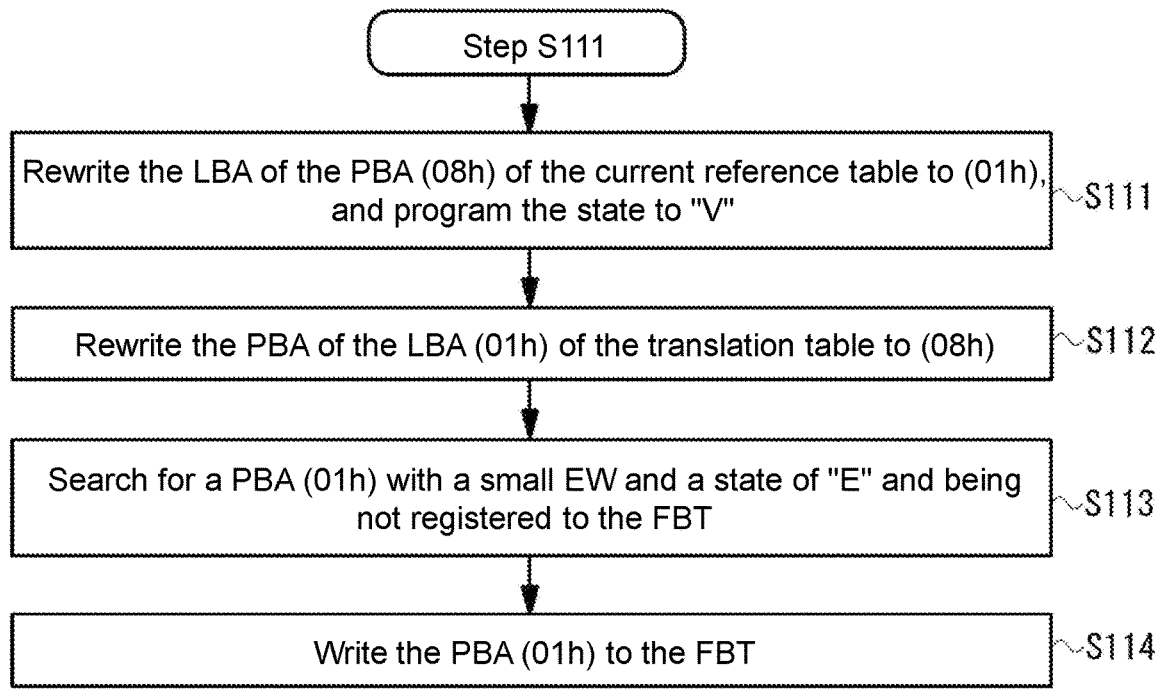
FIG. 10 is a flowchart illustrating an erasing operation according to an embodiment of the disclosure.

Then, the operation of erasing a block in the flash memory 100 is described below with reference to flowcharts of FIG. 9 and FIG. 10. The memory cell array 110 is set to have the states shown in FIG. 6. The external host device outputs an erasing command and the logical block address LBA (01h) indicating the to-be-erased block, and the flash memory 100 receives its output (S101).

The controller 140 translates the logical block address LBA (01h) into a physical block address PBA (07h) with reference of the translation table shown in FIG. 5(A). Then, the controller 140 determines a block with the small number of cycles of programming/erasing that should be erased next, and therefore reads out a start physical block address PBA (01h) of the IBT shown in FIG. 8(B) (S103).

Then, the controller 140 performs the erasing operation on the block determined by the physical block address PBA (01h) read from the IBT (S104). The physical block address PBA (07h) corresponding to the logical block address LBA (01h) indicated by the host device is inconsistent with the physical block address PBA (01h) read from the IBT, so that the block of the physical block address PBA (007) cannot be erased, and this block is managed as a to-be-erased invalid block (with the state "I"). In response to an instruction of the controller 140, the word line selection circuit 150 applies 0V to all the word lines of the selected block of the physical block address PBA (01h), and applies an erasing voltage to the P-well. The state of the block of the physical block address PBA (01h) at this moment is shown in FIG. 12. The spare area of the physical block address PBA (01h) becomes the erased usable state E.

Then, in order to reflect the state of the PBA (01h) of the memory cell array 110, the controller 140 rewrites the state of the PBA (01h) of the current reference table LUT shown in FIG. 5(B) from "I" to "E", and the number of cycles of programming/erasing EW is increased by 1 and changed to "2" (S105). The modified current reference table LUT is shown in FIG. 11(B), and the modified parts are indicated by dotted lines.

Then, the controller 140 programs the state of the page (03h) of the physical block address PBA (07h) of the memory cell array 110 to "I" (S106). The state of the spare area of the start page has been programmed to "V", and such area cannot be used. Therefore, a spare area of an unused page (03h) is used.

Then, the controller 140 rewrites the state of the physical block address PBA (07h) of the current reference table LUT to "I" in order to reflect the state of the physical block address PBA (07h) of the memory cell array 110 to the current reference table LUT (S107), and the state is shown in FIG. 11(B) (a dotted line part).

Then, the controller 140 writes the physical block address PBA (07h) into the IBT (S108). The IBT is a FIFO type, so that as shown in FIG. 13(B), the physical block address PBA (03h) is moved to a start entry #0, and the physical block address PBA (07h) is added to a last entry #1.

In this way, after the erasing operation corresponding to the erasing command coming from the host device is completed, the controller 140 searches the FBT for the physical block address PBA that should be allocated to the logical block address LBA (01h). Namely, the controller 140 reads the physical block address PBA (08h) of the start entry #0 of the FBT shown in FIG. 8(A) (S109).

Then, the controller 140 rewrites the logical block address LBA of the spare area of the page (00h) of the PBA (08h) of the memory cell array to (01h) according to the physical block address PBA (08h) read from the FBT, and programs the state to "V" (S110).

Then, the controller 140 allocates the block as a valid block in use at the physical block address PBA (08h) of the memory cell array, and accordingly rewrites the content of the current reference table LUT, i.e., rewrites the logical block address LBA of the physical block address PBA (08h) of the current reference table LUT to (01h), and rewrites the state from "E" to "V" (S111). The state is shown in FIG. 11(B) (the dotted line part).

Then, the controller 140 rewrites the translation table in a manner that the logical block address LBA (01h) of FIG. 5(A) corresponds to the physical block address (08h) (S112). The state is shown in FIG. 11(A) (the dotted line part).

Then, the controller 140 adds a physical block address to the FBT, and therefore searches the current reference table LUT for the physical block address with the small number of cycles of programming/erasing EW, and with the state of "E" and being not registered to the FBT (S113). In the embodiment, the physical block address PBA (01h) is searched.

Then, the controller 140 performs the writing operation in order to add the searched physical block address PBA (01h) to the FBT (S114). The state is shown in FIG. 13(A) (the dotted line part). In this way, a new physical block address (08h) with less number of cycles of programming/erasing is allocated to the logical block address LBA (01h), and the physical block address (01h) with less number of cycles of programming/erasing is added to the FBT.

According to the embodiment, during the erasing operation, the algorithm described above is used to erase the blocks and use the blocks, so that the number of cycles of programming/erasing between the blocks in the memory cell array may be smoothed to implement wear leveling between the blocks. As a result, the utilization efficiency of the flash memory may be improved.

Then, a second embodiment of the disclosure is described below. In the step S110 of the erasing operation, the controller 140 programs the logical block address LBA (01$h$) and the state "V" in the spare area of the page (01$h$) of the physical block address PBA (08$h$) of the memory cell array, but due to the programming, the maximum number of cycles of programming allowed on the same page will be consumed once. In the embodiment, in order to erase the waste, the state block table SBT used to manage the states of the erased state blocks shown in FIG. 8(C) is saved to a non-volatile memory for flexible use.

As shown in FIG. 8(C), the SBT extracts the state of the current reference block and shows the state of each physical block address PBA. The controller 140 rewrites the SBT (dotted line part) as shown in FIG. 13(c) when the state of the block changes during the erasing operation. Namely, the physical block address PBA (01$h$) is rewritten from the to-be-erased invalid block "I" to the erased block "E", the physical block address PBA (07$h$) is rewritten from the valid block in use "V" to the to-be-erased invalid block "I", and the physical block address PBA (08$h$) is rewritten from the erased block "E" to the valid block in use "V".

The controller 140 does not program the physical block address PBA (08$h$) whose state is changed from "E" to "V" in the erasing operation, and simultaneously programs the logical block address LBA (01$h$) and the state "V" in the spare area when receiving a programming command for the page (00$h$) of the physical block address PBA (08$h$) from the host device. Therefore, the number of cycles of programming on the page (00$h$) of the physical block address PBA (08$h$) is consumed once. During a period before the programming is completed, the SBT of the non-volatile memory is substituted, and thereafter, the SBT is erased. Moreover, when the state of the block is changed to "V", a new correspondence is established for the logical block address, so that in the SBT, the logical block address LBA is stored together, and the logical block address LBA is also programmed to the spare area.

Moreover, in the embodiment, the RRAM is used as the non-volatile memory, but an MRAM (magnetic memory) may also be used in addition to the RRAM as long as it may write data faster than the NAND memory.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A semiconductor memory device, comprising:
a memory cell array, comprising a plurality of blocks;
a first holding element, holding translation information for translating logical address information into physical address information;
a second holding element, holding the physical address information for identifying to-be-erased blocks of the plurality of blocks;
a third holding element, holding the physical address information for identifying erased usable blocks selected based on the number of cycles of programming/erasing;
an erasing element, erasing the plurality of blocks of the memory cell array; and
a control element,
wherein when an erasing command and first logical address information are received from external environment, the control element translates the first logical address information into first physical address information based on the translation information,
when second physical address information held by the second holding element is inconsistent with the first physical address information, the control element controls the erasing element to erase a block of the plurality of blocks corresponding to the second physical address information, and
the control element updates the translation information of the first holding element in a manner that third physical address information held by the third holding element corresponds to the first logical address information.

2. The semiconductor memory device according to claim 1, wherein the control element adds the first physical address information to the second holding element and deletes the third physical address information from the third holding element.

3. The semiconductor memory device according to claim 1, further comprising:
a programming element, configured to program data on a selected page of the memory cell array,
wherein the control element controls the programming element to program the first logical address information and a state indicating that the block is in use in a spare area of a selected page of a block of the plurality of blocks corresponding to the third physical address information.

4. The semiconductor memory device according to claim 3, wherein the control element controls the programming element to program a state indicating that the block has become the to-be-erased block in a spare area of a selected page of a block of the plurality of blocks corresponding to the first physical address information.

5. The semiconductor memory device according to claim 1, wherein information associated with a state of the plurality of blocks is programmed in an area determined by the memory cell array, and
the control element generates information held by the first holding element, the second holding element, and the third holding element based on the information associated with the state.

6. The semiconductor memory device according to claim 5, wherein when the control element is powered on, the control element reads out the information associated with the state from the memory cell array.

7. The semiconductor memory device according to claim 1, further comprising:
a fourth holding element, holding information associated with a state of each of the plurality of blocks when performing an erasing operation,
wherein the control element programs the information associated with the state held by the fourth holding element in a corresponding spare area of the memory cell array when performing a programming operation.

8. The semiconductor memory device according to claim 7, wherein the fourth holding element holds the information associated with the state in a non-volatile memory.

9. The semiconductor memory device according to claim 1, wherein the control element programs the state of the second physical address information held by the second holding element from a to-be-erased invalid block to an erased block and adds the number of cycles of programming/erasing by 1.

10. The semiconductor memory device according to claim 1, wherein the control element searches for a physical address information with a small number of cycles of programming/erasing, and with a state of erased block and being not registered to the third holding element, and the control element performs a writing operation in order to add the searched physical address information to the third holding element.

* * * * *